(12) United States Patent
Togashi et al.

(10) Patent No.: US 8,315,035 B2
(45) Date of Patent: Nov. 20, 2012

(54) MULTILAYER CAPACITOR AND METHOD OF MANUFACTURING SAME

(75) Inventors: Masaaki Togashi, Tokyo (JP); Sunao Masuda, Tokyo (JP); Hiroshi Abe, Nikaho (JP)

(73) Assignee: TDK Corporation, Tokyo (JP)

( * ) Notice: Subject to any disclaimer, the term of this patent is extended or adjusted under 35 U.S.C. 154(b) by 429 days.

(21) Appl. No.: 12/629,646

(22) Filed: Dec. 2, 2009

(65) Prior Publication Data

US 2010/0188798 A1   Jul. 29, 2010

(30) Foreign Application Priority Data

Jan. 28, 2009   (JP) .................... 2009-017086

(51) Int. Cl.
*H01G 4/228* (2006.01)
*H01G 2/20* (2006.01)
*H01G 4/06* (2006.01)

(52) U.S. Cl. ............. 361/306.3; 361/306.1; 361/308.1; 361/321.1; 361/321.2; 361/321.3

(58) Field of Classification Search .......... 361/321.1, 361/321.2, 321.3, 308.1, 310, 306.3, 306.1
See application file for complete search history.

(56) References Cited

U.S. PATENT DOCUMENTS

| | | | |
|---|---|---|---|
| 4,158,218 A * | 6/1979 | McLaurin et al. | 361/308.1 |
| 4,904,973 A | 2/1990 | Ikeda | |
| 4,908,934 A | 3/1990 | Ikeda | |
| 6,433,992 B2 * | 8/2002 | Nakagawa et al. | 361/301.4 |
| 6,519,135 B2 | 2/2003 | Sano et al. | |
| 2004/0183147 A1 * | 9/2004 | Togashi et al. | 257/414 |

FOREIGN PATENT DOCUMENTS

| | | |
|---|---|---|
| JP | U-61-186225 | 11/1986 |
| JP | A-63-313906 | 12/1988 |
| JP | U-2-9420 | 1/1990 |
| JP | A-06-151228 | 5/1994 |
| JP | A-2001-185446 | 7/2001 |

(Continued)

OTHER PUBLICATIONS

Office Action issued in Japanese Patent Application No. P2009-017086 on Feb. 1, 2011.

(Continued)

*Primary Examiner* — Eric Thomas
*Assistant Examiner* — Arun Ramaswamy
(74) *Attorney, Agent, or Firm* — Oliff & Berridge, PLC

(57) ABSTRACT

A multilayer capacitor which can prevent chattering noises from occurring and improve the packaging density and packaging yield, and a method of manufacturing a multilayer capacitor are provided. Even when an electrostrictive vibration is generated in this multilayer capacitor upon voltage application, a joint surface of a metal terminal can flex, so as to mitigate the electrostrictive vibration, thereby preventing chattering noises from occurring. The joint surface is formed with a cutout and thus can fully secure its flexibility. In this multilayer capacitor, a step formed by a terminal connecting surface, a substrate connecting surface, and the joint surface is positioned within an area overlapping a capacitor element body as seen in the laminating direction of dielectric layers. Therefore, solder fillets do not protrude out of the capacitor element body, whereby the packaging density on a mounting substrate K can be improved. The state of solder fillets is easy to see from the outside, and a connection yield can also be secured.

18 Claims, 13 Drawing Sheets

FOREIGN PATENT DOCUMENTS

| | | |
|---|---|---|
| JP | A-2002-329637 | 11/2002 |
| JP | A-2002-343680 | 11/2002 |
| JP | A-2004-266110 | 9/2004 |
| JP | A-2004-288847 | 10/2004 |
| JP | A-2006-024825 | 1/2006 |

OTHER PUBLICATIONS

Office Action issued in Japanese Patent Application No. P2009-017086 on Jul. 12, 2011.

* cited by examiner

Fig.4
(a)
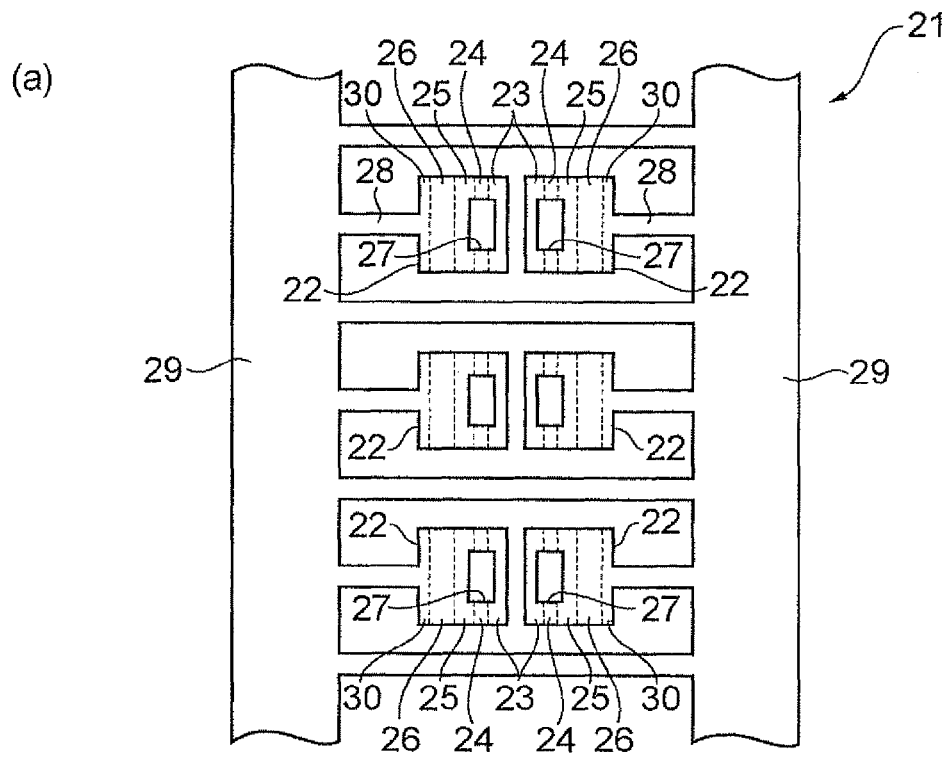
(b)
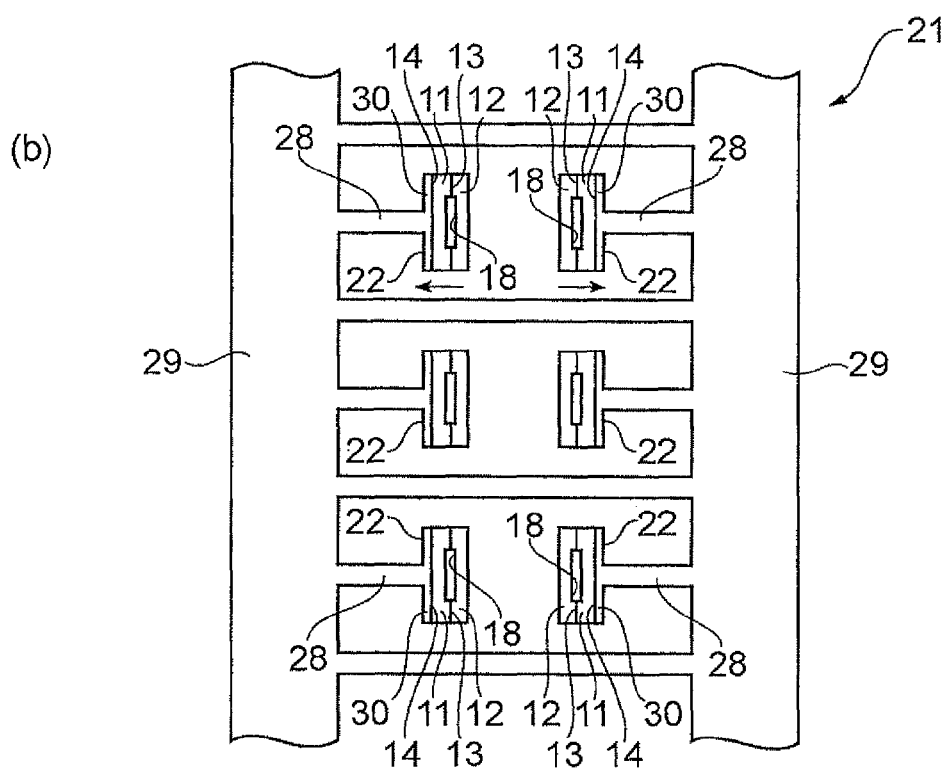

Fig.5
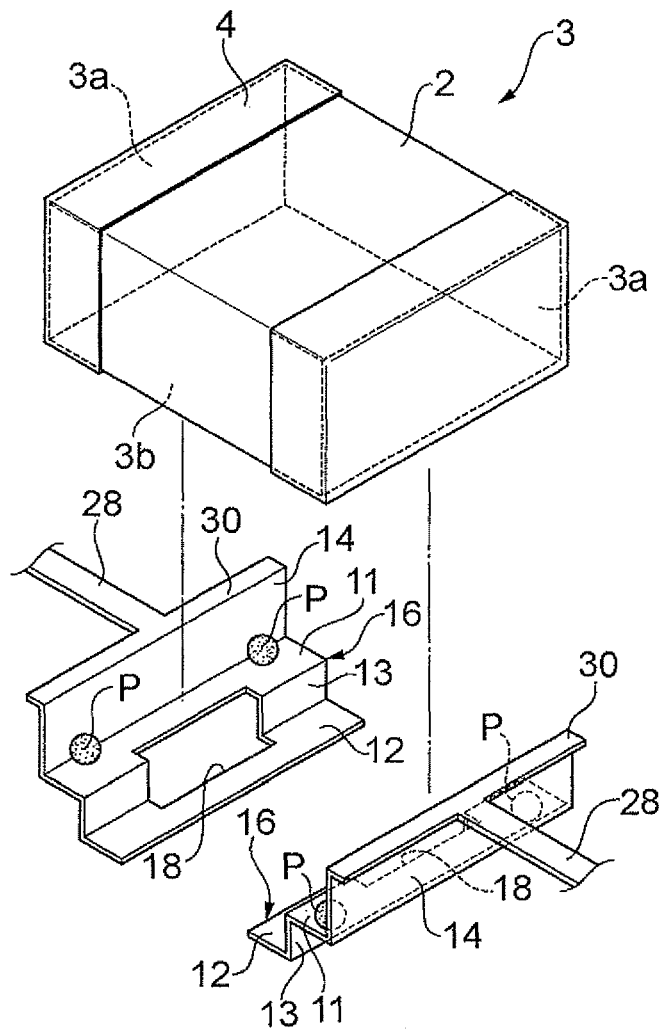
(a)
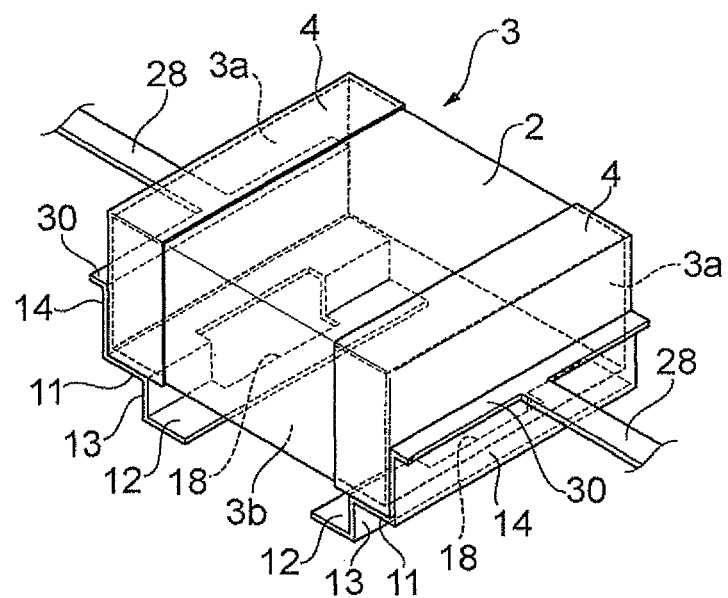
(b)

Fig.9
(a)
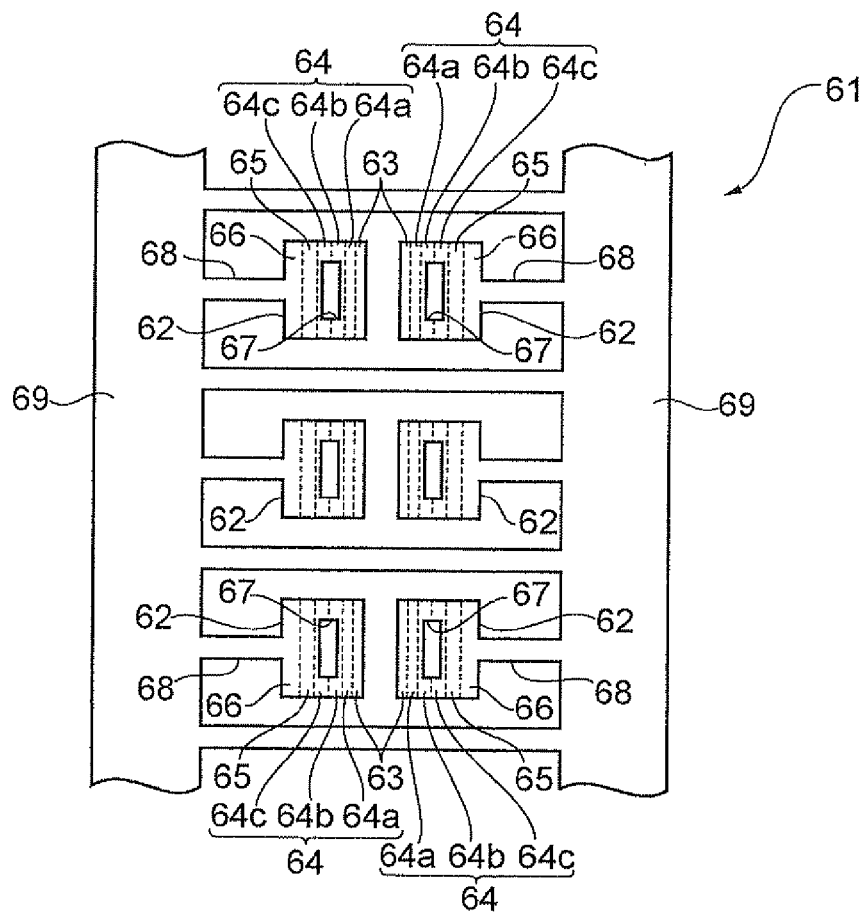
(b)
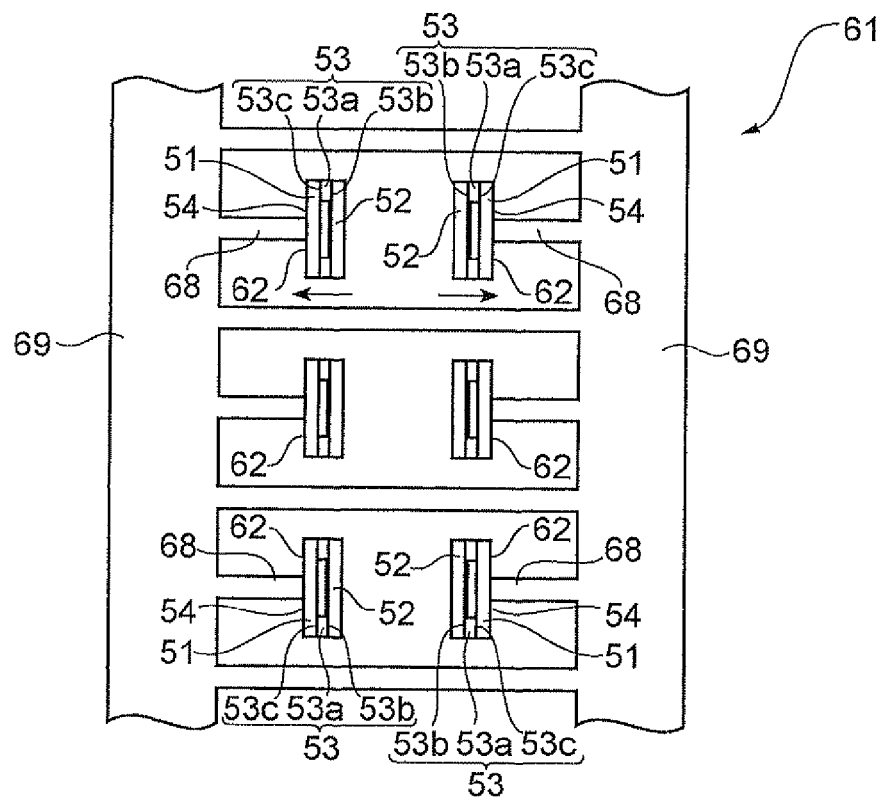

Fig.10
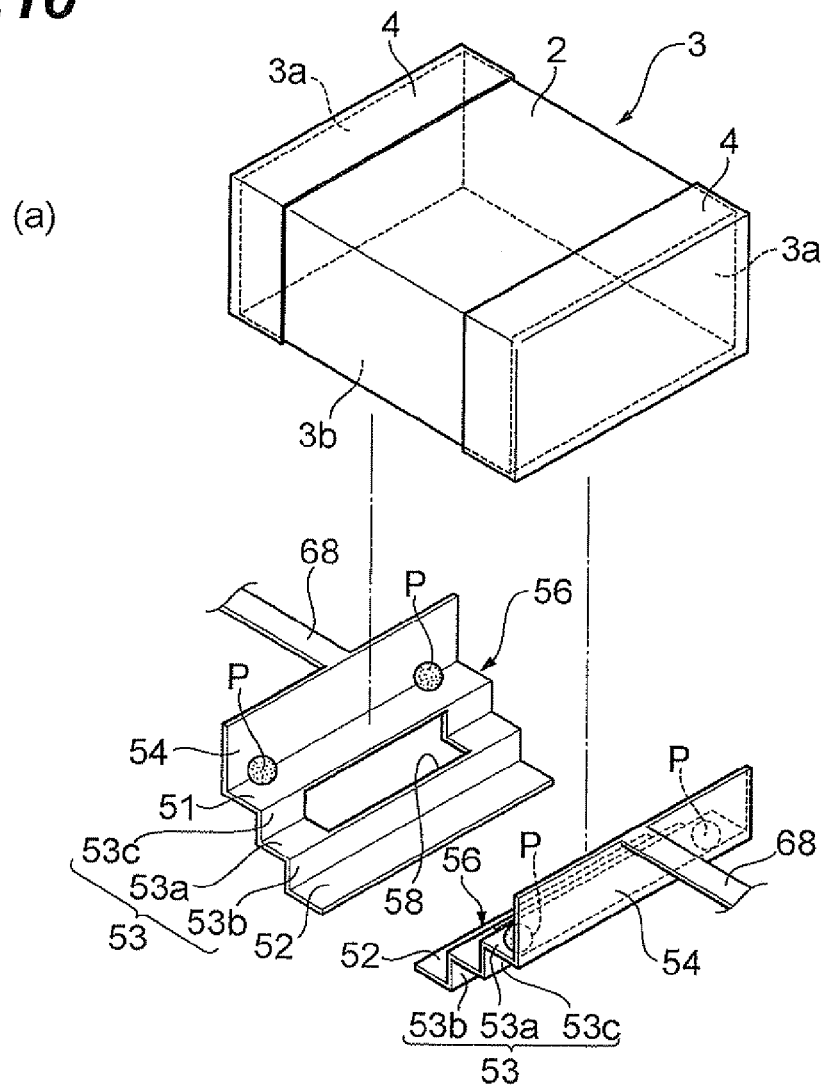
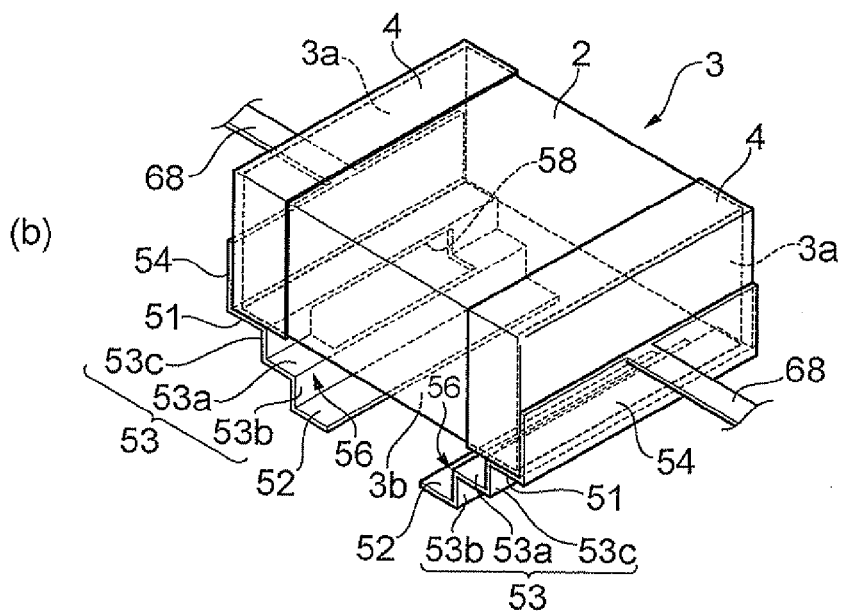

Fig.12
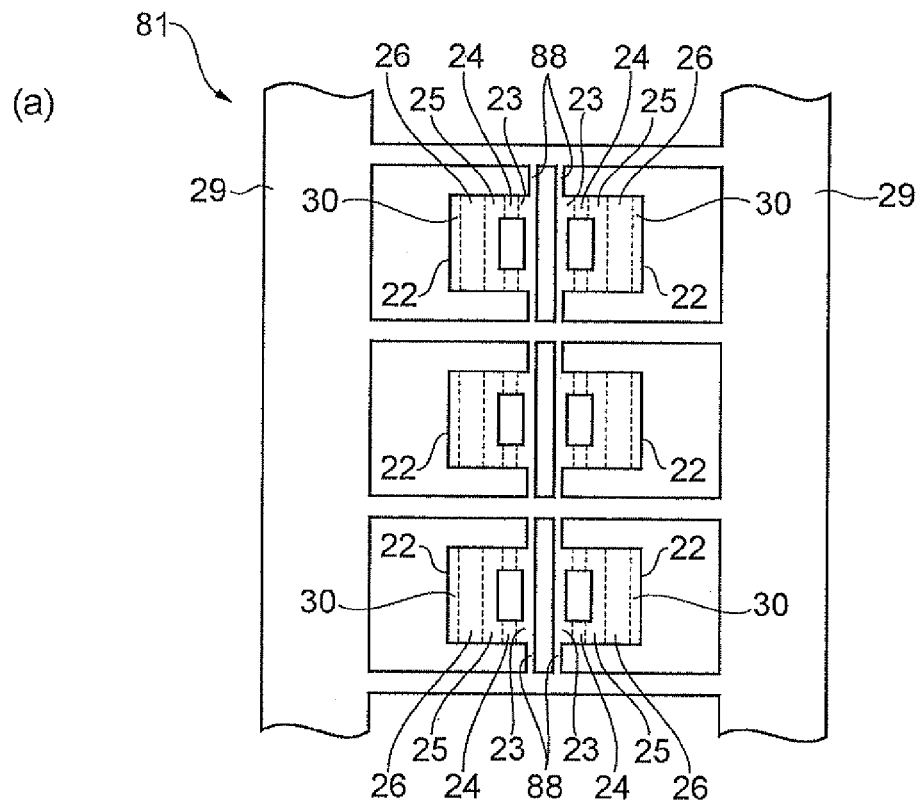
(a)
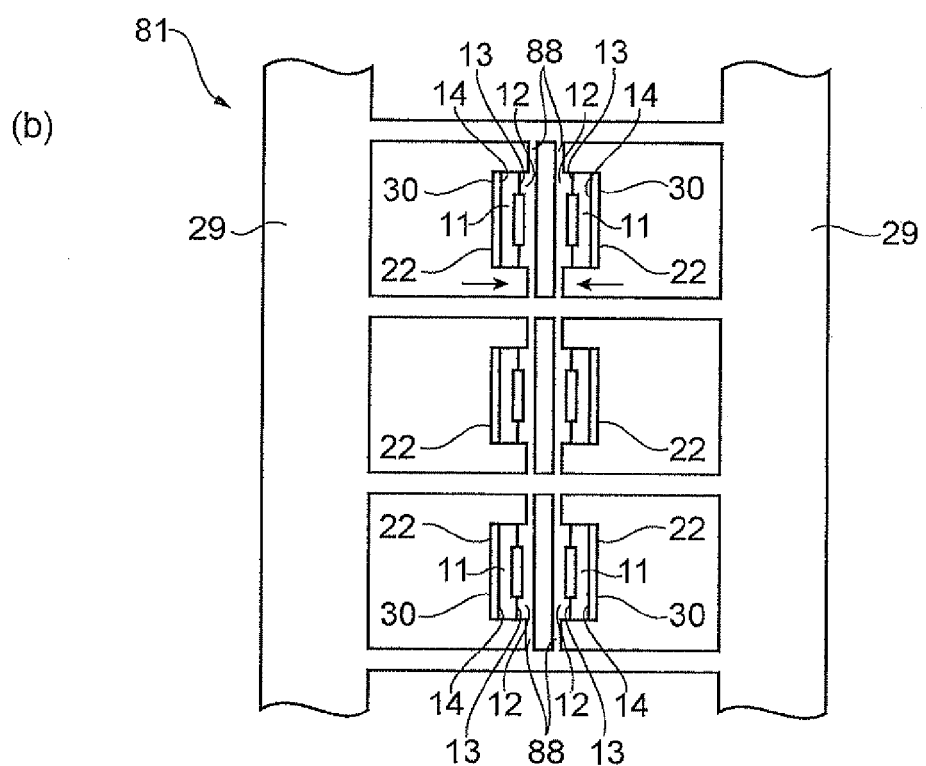
(b)

Fig.13
(a)
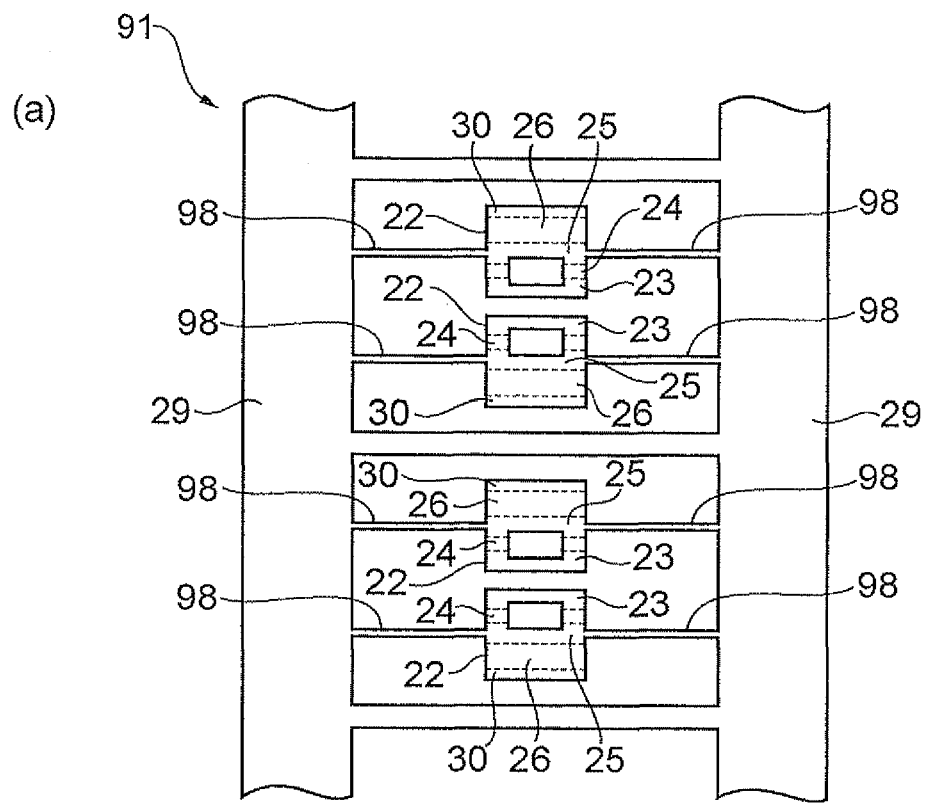
(b)
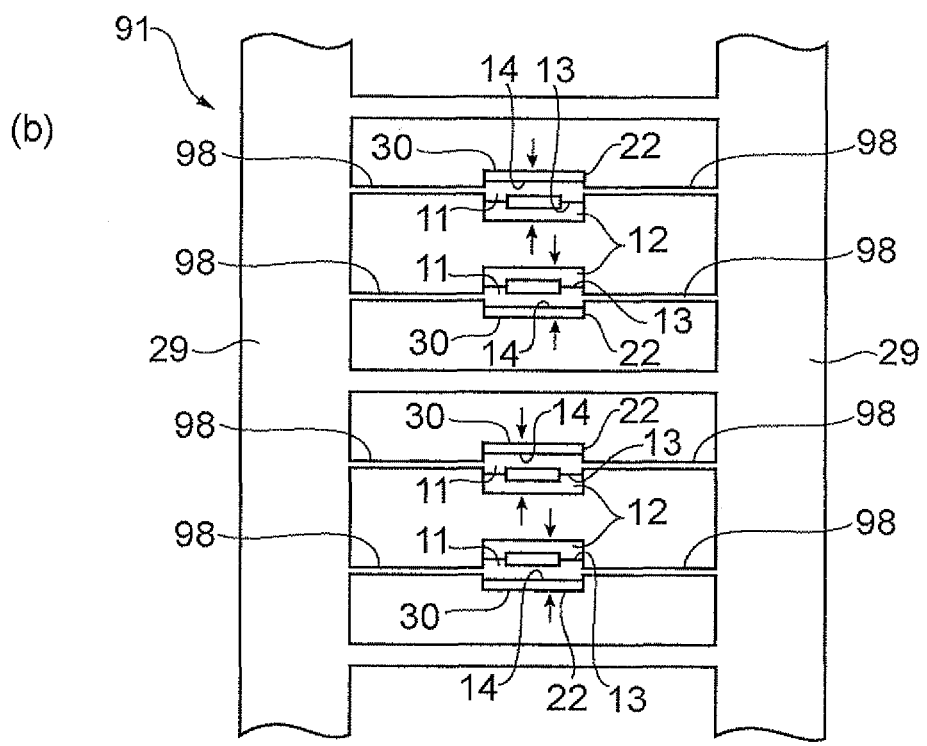

MULTILAYER CAPACITOR AND METHOD OF MANUFACTURING SAME

BACKGROUND OF THE INVENTION

1. Field of the Invention

The present invention relates to a multilayer capacitor and a method of manufacturing the same.

2. Related Background Art

A multilayer capacitor comprising a capacitor element body formed by laminating a plurality of dielectric layers, a plurality of inner electrodes formed within the capacitor element body, and a pair of terminal electrodes formed on side faces of the capacitor element body has conventionally been known. When a voltage is applied to the multilayer capacitor, a mechanical strain having a magnitude corresponding to the applied voltage is generated in the capacitor element body because of the electrostrictive effect. When an AC voltage is applied, the mechanical strain causes vibrations (electrostrictive vibrations) in the multilayer capacitor in particular. Hence, when an AC voltage is applied to a multilayer capacitor mounted on a substrate, electrostrictive vibrations may propagate to the substrate, thereby causing so-called chattering noises.

Therefore, for example, a multilayer capacitor disclosed in Japanese Patent Application Laid-Open No. 2004-266110 is provided with a metal terminal having an inner connecting part for clamping a capacitor element body side face formed with a terminal electrode, an outer connecting part for clamping a capacitor element body side face formed with no terminal electrode, and an intermediate part for joining the inner and outer connecting parts to each other. In this multilayer capacitor, the intermediate part is made thinner than the inner connecting part and adapted to flex, so as to absorb electrostrictive vibrations.

SUMMARY OF THE INVENTION

As mentioned above, the absorption of electrostrictive vibrations by utilizing the flexure of metal terminals seems to be effective in preventing multilayer capacitors from causing chattering noises. It is therefore important to further ameliorate the structure of multilayer capacitors comprising such metal terminals, so as to enhance their electrostrictive vibration absorbing performance and improve their easiness to manufacture.

In view of the fact that multilayer capacitors are mounted to a mounting substrate together with other electronic components, it is also necessary to improve their packaging density. For example, Japanese Patent Application Laid-Open No. 2001-185446 discloses a multilayer capacitor having a structure in which a leg of a metal terminal is erected at a lower part of a capacitor element body and has a leading end part bent out of the capacitor element body.

When connecting a multilayer capacitor having the structure of the patent literature mentioned above to a mounting substrate by solder reflow, however, solder fillets are positioned on the inside of the erect surface of the metal terminal in the lower part of the capacitor element body. This makes it hard to see the state of solder fillets from the outside, whereby a sufficient yield in the connection may not be obtained.

For overcoming the problem mentioned above, it is an object of the present invention to provide a multilayer capacitor which can prevent chattering noises from occurring and improve the packaging density and packaging yield, and a method of manufacturing a multilayer capacitor which can make such a multilayer capacitor in a simple procedure.

For achieving the above-mentioned object, the present invention provides a multilayer capacitor comprising a capacitor element body formed by laminating a plurality of dielectric layers, a terminal electrode formed so as to cover an end face of the capacitor element body, and a metal terminal disposed about the capacitor element body; wherein the metal terminal has a terminal connecting surface connected to the terminal electrode on a bottom face side of the capacitor element body, a substrate connecting surface arranged closer to a center of the capacitor element body than is the terminal connecting surface while being separated from the bottom face of the capacitor element body by a predetermined distance, and a joint surface raised from the substrate connecting surface and joined to the terminal connecting surface; and wherein the terminal connecting surface, substrate connecting surface, and joint surface form a step positioned within an area overlapping the capacitor element body as seen in the laminating direction of the dielectric layers, the step having a cutout at least in the joint surface.

Even when an electrostrictive vibration is generated in this multilayer capacitor upon voltage application, the joint surface joining the substrate connecting surface and terminal connecting surface to each other in the metal terminal disposed about the capacitor element body can flex, so as to mitigate the electrostrictive vibration, thereby preventing chattering noises from occurring. The joint surface is formed with a cutout and thus can fully secure its flexibility. In this multilayer capacitor, the step formed by the terminal connecting surface, substrate connecting surface, and joint surface is positioned within an area overlapping the capacitor element body as seen in the laminating direction of the dielectric layers. Therefore, solder fillets do not protrude out of the capacitor element body when connecting the multilayer capacitor to a mounting substrate by reflow, whereby the packaging density on the mounting substrate can be improved. Since the solder fillets can be positioned on the outside of the joint surface rising from the substrate connecting surface, the state of solder fillets is easy to see from the outside, and a connection yield can also be secured.

Preferably, the cutout extends from the terminal connecting surface to the substrate connecting surface in the step. This can further secure the flexibility of the joint surface, thereby more effectively preventing chattering noises from occurring.

Preferably, the metal terminal further has a rising surface rising from the terminal connecting surface so as to extend along the end face of the capacitor element body. This enables the metal terminal to support the capacitor element body firmly. When connecting the metal terminal to the capacitor element body, it becomes easier to align them with each other as well.

Preferably, the metal terminal has a height not exceeding that of the capacitor element body. This allows the multilayer capacitor to attain a lower profile.

Preferably, the metal terminal has no overlapping part as seen in the laminating direction of the dielectric layers. This makes it possible to form the metal terminal easily by unidirectionally pressing a lead frame, for example.

The present invention also provides a multilayer capacitor comprising a capacitor element body formed by laminating a plurality of dielectric layers, a terminal electrode formed so as to cover an end face of the capacitor element body, and a metal terminal disposed about the capacitor element body; wherein the metal terminal has a terminal connecting surface connected to the terminal electrode on a bottom face side of the capacitor element body, a substrate connecting surface arranged closer to a center of the capacitor element body than is the terminal connecting surface while being separated from the bottom face of the capacitor element body by a predetermined distance, and a joint surface joined to the substrate connecting surface and terminal connecting surface; wherein the joint surface has an intermediate surface arranged at a position between the terminal connecting surface and substrate connecting surface while being separated from the bottom face of the capacitor element body by a distance shorter than the predetermined distance, a first rising surface raised from the substrate connecting surface and joined to the intermediate surface, and a second rising surface raised from the intermediate surface and joined to the terminal connecting surface; and wherein the terminal connecting surface, substrate connecting surface, and joint surface form a step positioned within an area overlapping the capacitor element body as seen in the laminating direction of the dielectric layers.

Even when an electrostrictive vibration is generated in this multilayer capacitor upon voltage application, the joint surface joining the substrate connecting surface and terminal connecting surface to each other in the metal terminal disposed about the capacitor element body can flex, so as to mitigate the electrostrictive vibration, thereby preventing chattering noises from occurring. The joint surface is constructed by the intermediate surface, first rising surface, and second rising surface and thus can secure a sufficient length, whereby its flexibility is fully ensured. The step formed by the terminal connecting surface, substrate connecting surface, and joint surface is positioned within an area overlapping the capacitor element body as seen in the laminating direction of the dielectric layers. Therefore, solder fillets do not protrude out of the capacitor element body when connecting the multilayer capacitor to a mounting substrate by reflow, whereby the packaging density on the mounting substrate can be improved. Since the solder fillets can be positioned on the outside of the joint surface rising from the substrate connecting surface, the state of solder fillets is easy to see from the outside, and a connection yield can also be secured.

Preferably, a cutout is fowled in the joint surface. This can further secure the flexibility of the joint surface, thereby more effectively preventing chattering noises from occurring.

Preferably, a cutout is formed in the substrate connecting surface. This allows the cutout to inhibit electrostrictive vibrations from being transmitted from the metal terminal toward the mounting substrate, whereby chattering noises can more effectively be prevented from occurring.

Preferably, the metal terminal further has a rising surface rising from the terminal connecting surface so as to extend along the end face of the capacitor element body. This allows the metal terminal to support the capacitor element body firmly. When connecting the metal terminal to the capacitor element body, it becomes easier to align them with each other as well.

Preferably, the metal terminal has a height not exceeding that of the capacitor element body. This allows the multilayer capacitor to attain a lower profile.

Preferably, the metal terminal has no overlapping part as seen in the laminating direction of the dielectric layers. This makes it possible to form the metal terminal easily by unidirectionally pressing a lead frame, for example.

The present invention provides a method of manufacturing the above-mentioned multilayer capacitor, the method comprising the steps of preparing a lead frame patterned with at least one pair of planar parts each corresponding to the metal terminal, the planar parts opposing each other and being joined to an outer frame through a frame joint part; unidirectionally pressing and bending each of the planar parts so as to form a step constituted by the terminal connecting surface, substrate connecting surface, and joint surface; mounting the capacitor element body on the terminal connecting surface and connecting the terminal electrode of the capacitor element body to the terminal connecting surface; and separating the frame joint part from the planar part.

This multilayer capacitor manufacturing method can form the step constituted by the terminal connecting surface, substrate connecting surface, and joint surface at once by a simple procedure of unidirectionally pressing a planar part of a lead frame. Mounting the capacitor element body onto the terminal connecting surface can easily connect the terminal electrode of the capacitor element body to the terminal connecting surface.

Preferably, the frame joint part joins a terminal connecting surface equivalent part side of the planar part to the outer frame. This inhibits the terminal connecting surface from changing its position between before and after pressing the planar part, whereby the positional deviation between the terminal electrode of the capacitor element body and the terminal connecting surface at the time of mounting the capacitor element body onto the terminal connecting surface can be suppressed.

Preferably, the planar part is provided with a margin unbendable by the pressing. This can keep the terminal electrode from being damaged even when some misalignment in cutting occurs at the time of separating the frame joint part from the planar part.

Preferably, the frame joint part joins a substrate connecting surface equivalent part side of the planar part to the outer frame. This inhibits the substrate connecting surface from changing its position between before and after pressing the planar part, whereby deviations in pitches among planar parts due to pressing can be suppressed.

Preferably, a surface of the lead frame is plated with solder. In this case, the terminal electrode of the capacitor element body and the terminal connecting surface can easily be connected to each other by heat treatment after mounting the capacitor element body on the terminal connecting surface.

As in the foregoing, the multilayer capacitor in accordance with the present invention can prevent chattering noises from occurring and improve the packaging density and packaging yield. The multilayer capacitor manufacturing method in accordance with the present invention can make such a multilayer capacitor in a simple procedure.

BRIEF DESCRIPTION OF THE DRAWINGS

FIG. 4 is a view illustrating a manufacturing process of the multilayer capacitor illustrated in FIG. 1;

FIG. 5 is a view illustrating a process subsequent to that of FIG. 4;

FIG. 9 is a view illustrating a manufacturing process of the multilayer capacitor illustrated in FIG. 6;

FIG. 10 is a view illustrating a process subsequent to that of FIG. 9;

FIG. 12 is a view illustrating a modified example of a lead frame; and

FIG. 13 is a view illustrating another modified example of the lead frame.

DESCRIPTION OF THE PREFERRED EMBODIMENTS

In the following, preferred embodiments of the multilayer capacitor and multilayer capacitor manufacturing method in accordance with the present invention will be explained in detail with reference to the drawings.

First Embodiment

Figure 1:
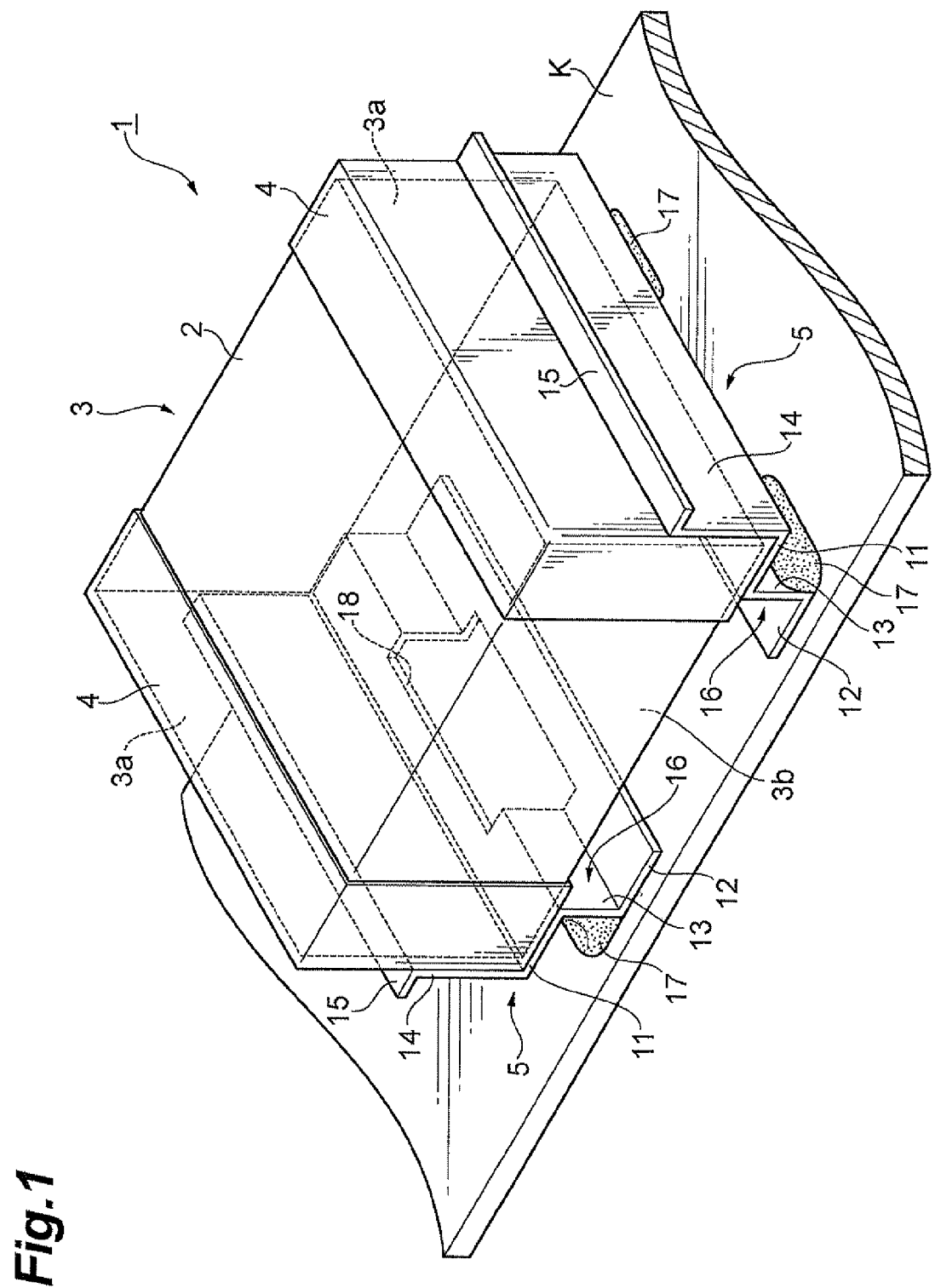
FIG. 1 is a perspective view illustrating the multilayer capacitor in accordance with a first embodiment of the present invention.
Figure 2:
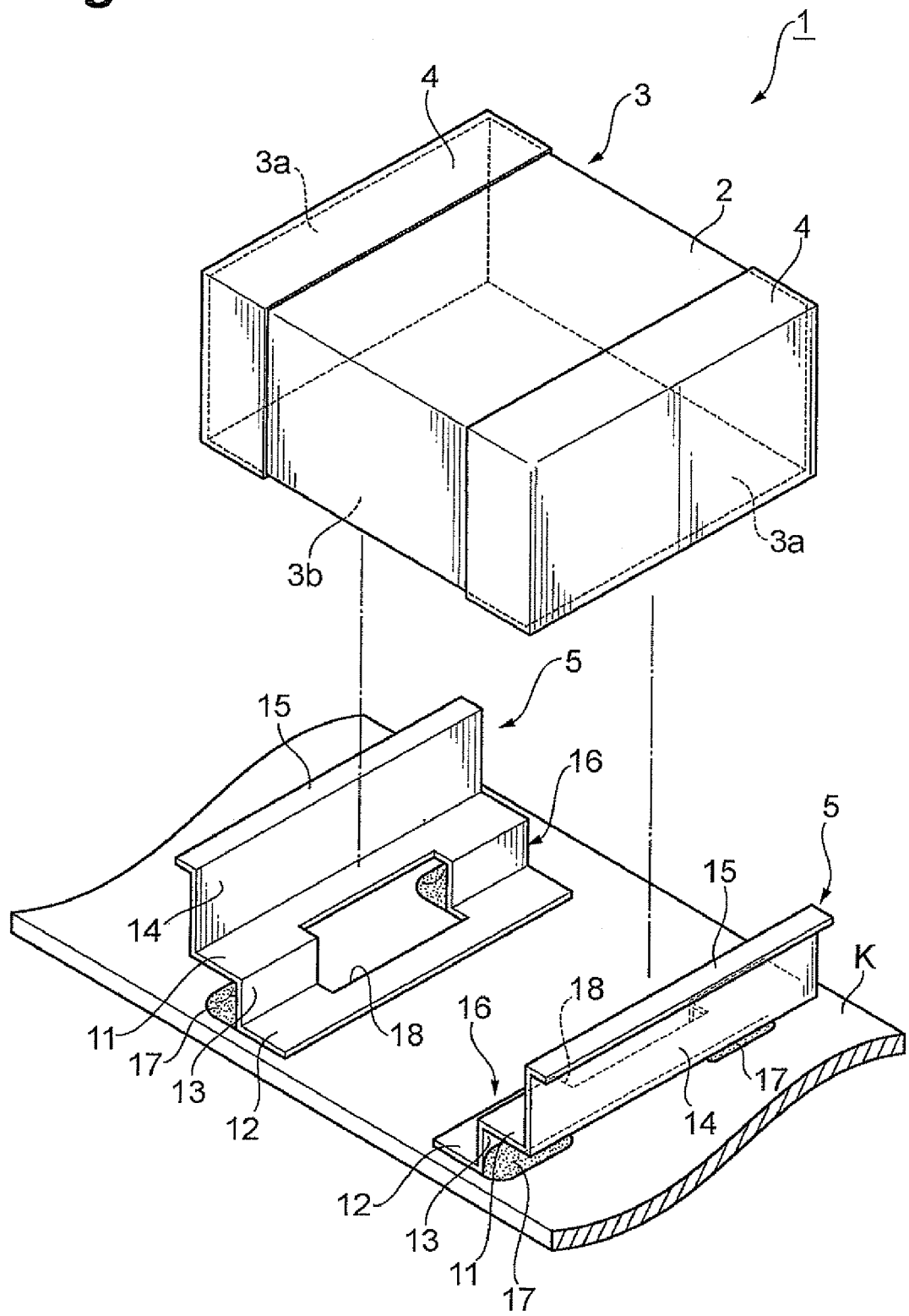
FIG. 2 is an exploded perspective view of the multilayer capacitor illustrated in FIG. 1.

FIG. 1 is a perspective view illustrating the multilayer capacitor in accordance with the first embodiment of the present invention. FIG. 2 is an exploded perspective view of FIG. 1, while FIG. 3 is a side view thereof.

Figure 3:
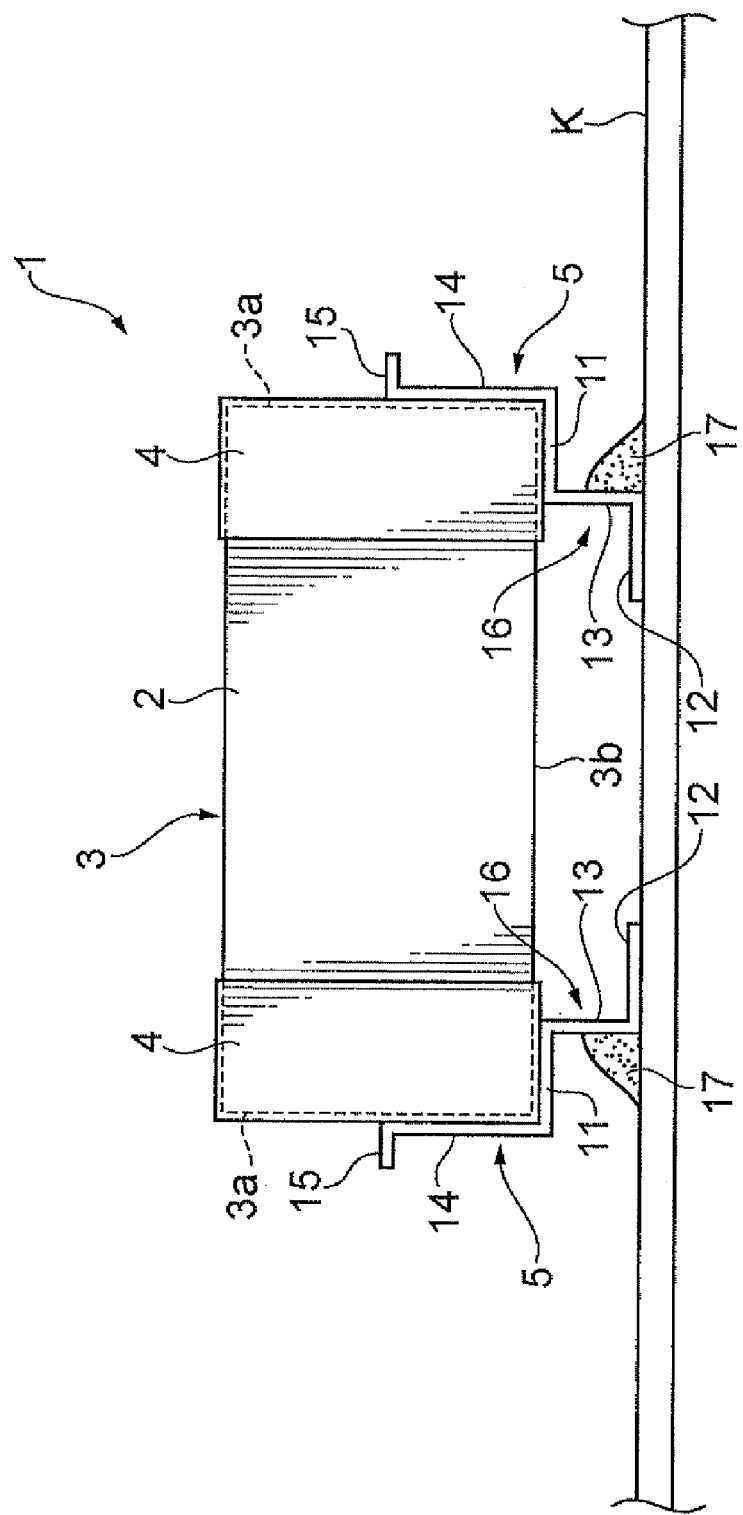
FIG. 3 is a side view of the multilayer capacitor illustrated in FIG. 1.

As illustrated in FIGS. 1 to 3, the multilayer capacitor 1 in accordance with the first embodiment, which is a multilayer ceramic capacitor of 2012 type (having a length of 2.0 mm, a width of 1.2 mm, and a height of 1.0 mm), for example, comprises a substantially rectangular parallelepiped capacitor element body 3 formed by laminating a plurality of dielectric layers 2, a pair of terminal electrodes 4, 4 formed so as to cover longitudinal end faces 3a, 3a of the capacitor element body 3, and a pair of metal terminals 5, 5 disposed about the capacitor element body 3.

The dielectric layers 2 constituting the capacitor element body 3 are formed by sintering a multilayer body of ceramic green sheets containing a dielectric ceramic based on $BaTiO_3$, $Ba(Ti, Zr)O_3$, or $(Ba, Ca)TiO_3$, for example. In the capacitor element body 3, the dielectric layers 2 are integrated to such an extent that their boundaries are invisible.

First and second inner electrodes which are not depicted are disposed within the capacitor element body 3. For example, each of the first and second inner electrodes is made by forming a pattern of a conductive paste containing Ni onto a ceramic green sheet by printing or the like and sintering the pattern together with the ceramic green sheet.

The first and second inner electrodes are alternately arranged while holding therebetween the dielectric layer 2 corresponding to at least one green sheet layer in the laminating direction. An end part of the first inner electrode extends to one of the longitudinal end faces 3a of the capacitor element body, while an end part of the second inner electrode extends to the other of the longitudinal end faces 3a of the capacitor element body.

A capacitor element body area held between the first and second inner electrodes is a part substantially generating a capacitance in the multilayer capacitor 1. This capacitor element body area is also an area generating a mechanical strain because of the electrostrictive effect. That is, when a voltage is applied between the first and second inner electrodes, the capacitor element body area expands in the laminating direction of the capacitor element body 3 and shrinks in directions connecting the opposing side faces of the capacitor element body 3.

The terminal electrodes 4 are formed by applying and burning a conductive paste containing a conductive metal powder and glass frit onto the side faces 3a, 3a of the capacitor element body 3, for example. Plating layers may be formed on the surfaces of the burned terminal electrodes 4 when necessary. The conductive paste may be applied by dipping, for example.

The metal terminals 5 will now be explained. Each metal terminal 5 has a planar form with substantially the same width as that of the capacitor element body 3 and comprises a terminal connecting surface 11 to become a connecting end to the terminal electrode 4, a substrate connecting surface 12 to become a connecting end to a mounting substrate K, a joint surface 13 for joining the terminal connecting surface 11 and substrate connecting surface 12 to each other, a rising surface 14 rising from the terminal connecting surface 11, and a flange surface 15 disposed at a leading end of the rising surface 14.

The terminal connecting surface 11 extends along a longitudinal edge part of the bottom face 3b of the capacitor element body 3 and is bonded by reflow of cream solder P (see FIG. 5(a)), for example, to an electrode part of the terminal electrode 4 routed to the bottom face 3b side of the capacitor element body 3. The substrate connecting surface 12 is arranged closer to the center of the capacitor element body 3 than is the terminal connecting surface 11 while being separated by a predetermined distance from the bottom face 3b of the capacitor element body 3. The joint surface 13 is arranged substantially at right angles to the terminal connecting surface 11 and substrate connecting surface 12 and joins the end part of the terminal connecting surface 11 on the center side of the capacitor element body 3 to the end part of the substrate connecting surface 12 on the outer side of the capacitor element body 3, so as to form a step 16.

The step 16 is positioned within an area overlapping the capacitor element body 3 when the multilayer capacitor 1 is seen in the laminating direction of the dielectric layers 2, and is located within a space held between the multilayer capacitor 1 and mounting substrate K in a mounted state. The step 16 is connected to the mounting substrate K by reflow of cream solder, for example, while the substrate connecting surface 12 is in contact with a land electrode (not depicted). Without protruding out of the capacitor element body 3, solder fillets 17 are formed on the outside of the joint surface 13 rising from the substrate connecting surface 12.

A rectangular cutout 18 is formed at substantially the center part of the step 16. The cutout 18 extends from the end part of the terminal connecting surface 11 on the center side of the capacitor element body 3 to the end part of the substrate connecting surface 12 on the outer side of the capacitor element body through the joint surface 13. Thus configured cutout 18 reduces the area of the joint surface 13 and secures the flexibility of the latter.

The rising surface 14 rises substantially at right angles from the end part of the terminal connecting surface 11 on the outer side of the capacitor element body 3 by a height which is about half that of the capacitor element body 3 and extends along the end face 3a of the capacitor element body 3. The rising surface 14 functions as a positioning member when connecting the capacitor element body 3 to the metal terminal 5 and firmly supports the capacitor element body 3 connected to the metal terminal 5.

The flange surface 15 projects substantially at right angles from the leading end of the rising surface 14 to the outside of the capacitor element body 3. The flange surface 15 projects by about 0.3 mm, for example, and functions as a member for protecting the terminal electrode 4 when separating the metal terminal 5 from a lead frame 21 (see FIG. 4) in a manufacturing process of the multilayer capacitor 1 which will be explained later.

In thus constructed metal terminal 5, the terminal connecting surface 11, substrate connecting surface 12, joint surface 13, rising surface 14, and flange surface 15 have no overlapping parts as seen in the laminating direction of the dielectric layers 2 in the capacitor element body 3, thereby making it possible to form the metal terminal 5 by a simple procedure of unidirectionally pressing the lead frame 21. The height of the metal terminal 5 from the position of the substrate connecting surface 12 to the position of the flange surface 15 is smaller than the height of the capacitor element body 3. This allows the multilayer capacitor 1 to attain a lower profile.

A manufacturing process of the above-mentioned multilayer capacitor 1 will now be explained.

First, the lead frame 21 is prepared as illustrated in FIG. 4(a). By punching a metal sheet, for example, the lead frame 21 is formed with patterns of pairs of opposing planar parts 22, 22, each corresponding to the metal terminal 5, at predetermined pitches.

Each planar part 22 comprises a substrate connecting surface equivalent part 23, a joint surface equivalent part 24, a terminal connecting surface equivalent part 25, and a rising surface equivalent part 26 in order from the leading end side, and is provided beforehand with a rectangular hole 27 corresponding to the cutout 18 and extending from the substrate connecting surface equivalent part 23 to the terminal connecting surface equivalent part 25. A band-shaped frame joint part 28 extends from the edge portion of the planar part 22 on the terminal connecting surface equivalent part 25 side, whereby the planar part 22 is joined to an outer frame 29 of the lead frame 21.

Next, by using a predetermined jig, each planar part 22 is unidirectionally pressed and bent, so as to form the step 16 constituted by the terminal connecting surface 11, substrate connecting surface 12, and joint surface 13, the rising surface 14, and the cutout 18 at the same time as illustrated in FIG. 4(b). Here, a portion of the planar part 22 which joins with the frame joint part 28 is provided with a margin 30 which is unbendable by the pressing.

After pressing the planar part 22, ball-shaped cream solder pieces P, P are arranged at two positions on a surface of the terminal connecting surface 11 holding the cutout 18 therebetween as illustrated in FIG. 5(a). Subsequently, as illustrated in FIG. 5(b), the capacitor element body 3 is mounted on the terminal connecting surface 11 while positioning the terminal electrode 4 such that the rising surface 14 extends along the end face 3a of the capacitor element body 3, and the planar part 22 and capacitor element body 3 are connected to each other by reflow.

Thereafter, the leading end of the frame joint part 28 is cut by a blade or the like, so as to separate the planar part 22 from the frame joint part 28, thereby completing the multilayer capacitor 1 illustrated in FIGS. 1 to 3. When cutting the leading end of the frame joint part 28, the margin 30 becomes the flange surface 15 of the metal terminal 5 as it is. This can keep the terminal electrode 4 from being damaged even when some misalignment in cutting occurs at the time of separating the frame joint part 28 from the planar part 22. For connecting the multilayer capacitor 1 to the mounting substrate K, it will be sufficient if solder fillets 17 are formed on the outside of the joint surface 13 rising from the substrate connecting surface 12 by reflow of cream solder, so as to bond a land electrode of the mounting substrate K to the substrate connecting surface 12, for example.

As explained in the foregoing, even when an electrostrictive vibration is generated in the multilayer capacitor 1 upon voltage application, the joint surface 13 joining the substrate connecting surface 12 and terminal connecting surface 11 to each other in the metal terminal 5 disposed about the capacitor element body 3 can flex, so as to mitigate the electrostrictive vibration, thereby preventing chattering noises from occurring. The joint surface 13 is formed with the cutout 18 extending from the end part of the terminal connecting surface 11 on the center side of the capacitor element body 3 to the end part of the substrate connecting surface 12 on the outer side of the capacitor element body 3 through the joint surface 13, and thus fully secures the flexibility.

In the multilayer capacitor 1, the step 16 formed by the terminal connecting surface 11, substrate connecting surface 12, and joint surface 13 is positioned within an area overlapping the capacitor element body 3 as seen in the laminating direction of the dielectric layers 2. Therefore, the solder fillets 17 for connecting the multilayer capacitor 1 to the mounting substrate K by reflow do not protrude out of the capacitor element body 3, whereby the packaging density on the mounting substrate K can be improved. The solder fillets 17 can be positioned on the outside of the joint surface 13 rising from the substrate connecting surface 12, so as to make the state of the solder fillets 17 easy to see from the outside and secure a connection yield.

The above-mentioned multilayer capacitor manufacturing method can form the step 16 constituted by the terminal connecting surface 11, substrate connecting surface 12, and joint surface 13 at once by a simple procedure of just unidirectionally pressing the planar part 22 of the lead frame 21. Mounting the capacitor element body 3 on the terminal connecting surface 11 can easily connect the terminal electrode 4 of the capacitor element body 3 to the terminal connecting surface 11 and arrange the step 16 within an area overlapping the capacitor element body 3 as seen in the laminating direction of the dielectric layers 2 at the same time.

In the lead frame 21, the frame joint part 28 joins the terminal connecting surface equivalent part 25 side of the planar part 22 to the outer frame 29. This inhibits the terminal connecting surface 11 from changing its position between before and after pressing the planar part 22 (see FIG. 4), whereby the positional deviation between the terminal electrode 4 of the capacitor element body 3 and the terminal connecting surface 11 at the time of mounting the capacitor element body 3 onto the terminal connecting surface 11 can be suppressed.

Second Embodiment

Figure 6:
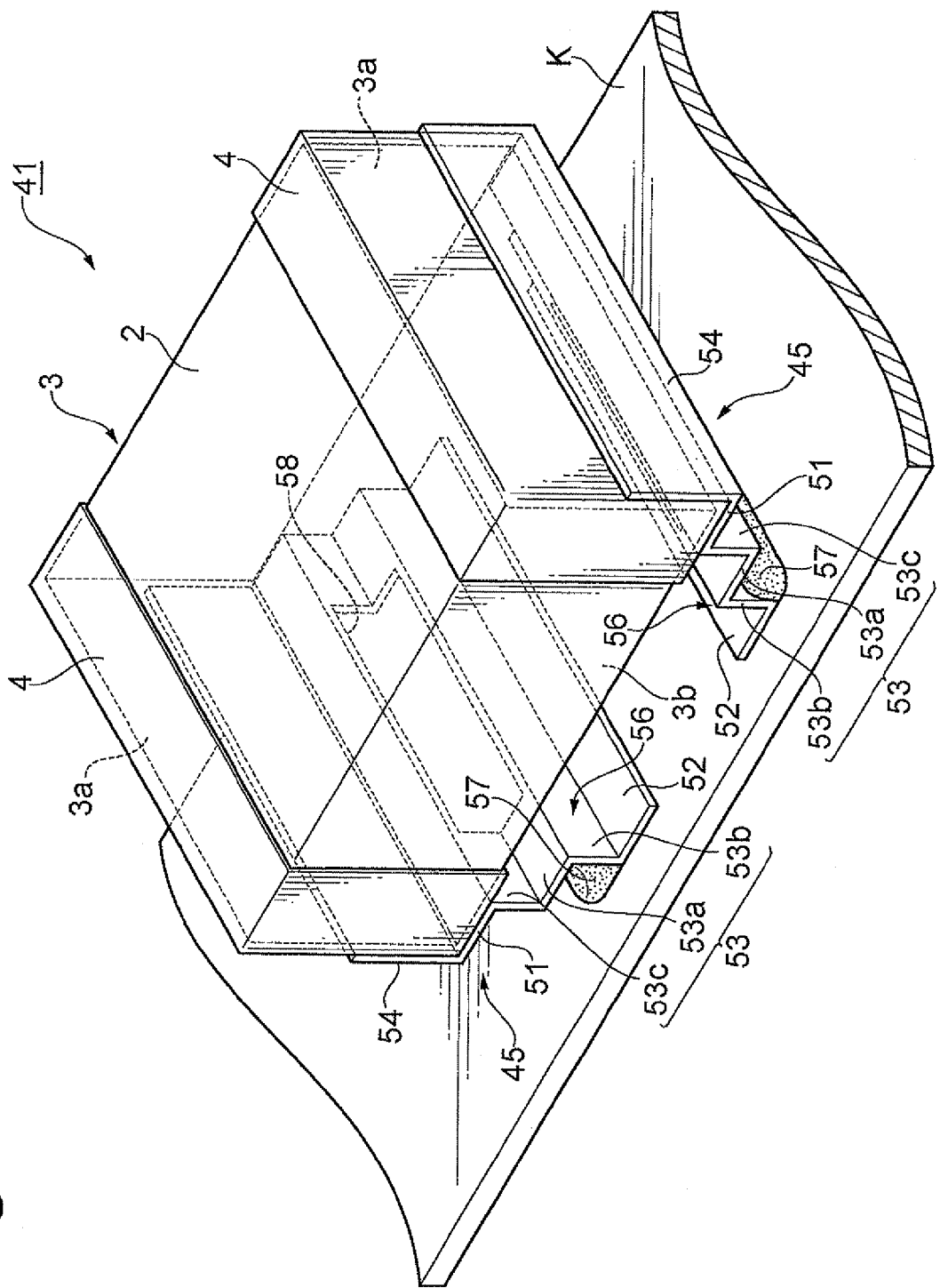
FIG. 6 is a perspective view illustrating the multilayer capacitor in accordance with a second embodiment of the present invention.
Figure 7:
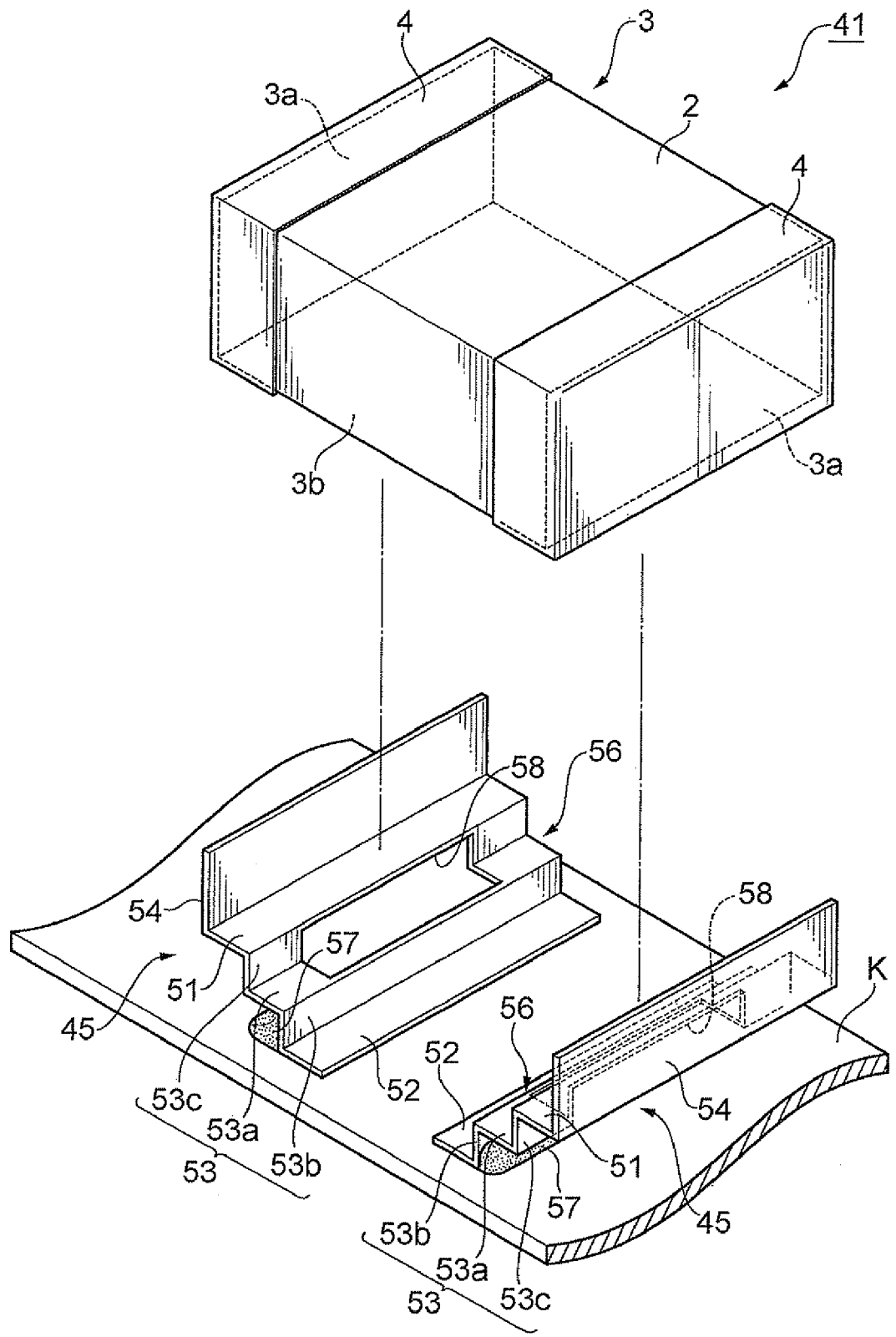
FIG. 7 is an exploded perspective view of the multilayer capacitor illustrated in FIG. 6.

The second embodiment of the present invention will now be explained. FIG. 6 is a perspective view illustrating the multilayer capacitor in accordance with the second embodiment of the present invention. FIG. 7 is an exploded perspective view of FIG. 6, while FIG. 8 is a side view thereof.

Figure 8:
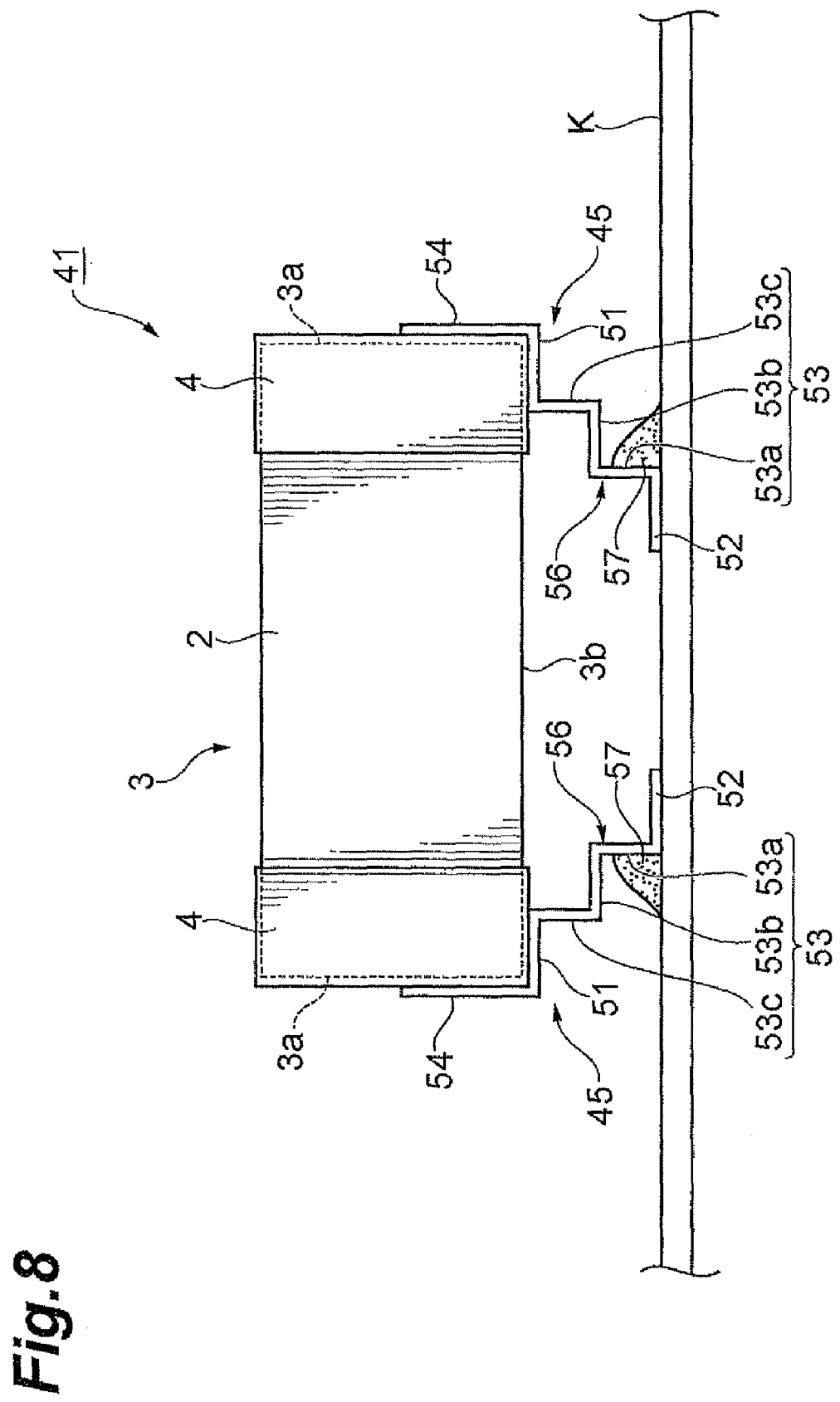
FIG. 8 is a side view of the multilayer capacitor illustrated in FIG. 6.

As illustrated in FIGS. 6 to 8, the multilayer capacitor 41 in accordance with the second embodiment differs from the first embodiment in the structure of a joint surface 53 in each metal terminal 45. That is, the joint surface 53 of the metal terminal 45 in the multilayer capacitor 41 is constituted by an intermediate surface 53a arranged at a position between the terminal connecting surface 51 and substrate connecting surface 52, a first rising surface 53b raised substantially at right angles from the substrate connecting surface 52 and joined to the intermediate surface 53a, and a second rising surface 53c raised substantially at right angles from the intermediate surface 53a and joined to the terminal connecting surface 51.

The intermediate surface 53a is positioned in substantially the middle of the height between the terminal connecting surface 51 and substrate connecting surface 52, while being separated from the bottom face 3b of the capacitor element body 3 by a distance which is substantially half that between the substrate connecting surface 52 and the bottom face 3*b* of the capacitor element body 3. The first rising surface 53*b* joins the end part of the substrate connecting surface 52 on the outer side of the capacitor element body to the end part of the intermediate surface 53*a* on the center side of the capacitor element body, while the second rising surface 53*c* joins the end part of the intermediate surface 53*a* on the outer side of the capacitor element body to the end part of the terminal connecting surface 51 on the center side of the capacitor element body.

As in the first embodiment, the step 56 formed by the terminal connecting surface 51, substrate connecting surface 52, and joint surface 53 is positioned within an area overlapping the capacitor element body 3 when the multilayer capacitor 41 is seen in the laminating direction of the dielectric layers 2, and is located within a space held between the multilayer capacitor 1 and mounting substrate K in a mounted state. The step 56 is connected to the mounting substrate K by reflow of cream solder, for example, while the substrate connecting surface 52 is in contact with a land electrode (not depicted). Without protruding out of the capacitor element body 3, solder fillets 57 are formed on the outside of the first rising surface 53*b* rising from the substrate connecting surface 52.

A rectangular cutout 58 is formed at substantially the center part of the step 56. In the joint surface 53, the cutout 58 extends from the upper part of the second rising surface 53*c* to the end part of the intermediate surface 53 on the center side of the capacitor element body. Thus configured cutout 58 reduces the area of the joint surface 53 and secures the flexibility of the latter.

In the metal terminal 45, the rising surface 54 rises substantially at right angles from the end part of the terminal connecting surface 51 on the outer side of the capacitor element body 3 by a height which is about half that of the capacitor element body 3 and extends along the end face 3*a* of the capacitor element body 3 as in the first embodiment but has no flange surface at the leading end. Therefore, the packaging density of the multilayer capacitor 41 can be improved by the area of the flange surface that might have projected out.

A manufacturing process of the above-mentioned multilayer capacitor 41 will now be explained.

First, as illustrated in FIG. 9(*a*), a lead frame 61 is prepared. By punching a metal sheet, for example, the lead frame 61 is formed with patterns of pairs of opposing planar parts 62, 62, each corresponding to the metal terminal 45, at predetermined pitches.

Each planar part 62 comprises a substrate connecting surface equivalent part 63, a joint surface equivalent part 64 (constituted by a first rising surface equivalent part 64*a*, an intermediate surface equivalent part 64*b*, and a second rising surface equivalent part 64*c*), a terminal connecting surface equivalent part 65, and a rising surface equivalent part 66 in order from the leading end side, and is provided beforehand with a rectangular hole 67 corresponding to the cutout 58 and extending over the intermediate surface equivalent part 64*b* and second rising surface equivalent part 64*c*. A band-shaped frame joint part 68 extends from the edge portion of the planar part 62 on the terminal connecting surface equivalent part 65 side, thereby joining the planar part 62 to an outer frame 69 of the lead frame 61.

Next, by using a predetermined jig, each planar part 62 is unidirectionally pressed and bent, so as to form the step 56 constituted by the terminal connecting surface 51, substrate connecting surface 52, and joint surface 53, the rising surface 54, and the cutout 58 at the same time as illustrated in FIG. 9(*b*).

After pressing the planar part 62, ball-shaped cream solder pieces P, P are arranged at two positions on a surface of the terminal connecting surface 51 holding the cutout 58 therebetween as illustrated in FIG. 10(*a*). Subsequently, as illustrated in FIG. 10(*b*), the capacitor element body 3 is mounted on the terminal connecting surface 51 while positioning the terminal electrode 4 such that the rising surface 54 extends along the end face 3*a* of the capacitor element body 3, and the planar part 62 and capacitor element body 3 are connected to each other by reflow.

Thereafter, the leading end of the frame joint part 68 is cut by a blade or the like, so as to separate the planar part 62 from the frame joint part 68, thereby completing the multilayer capacitor 41 illustrated in FIGS. 6 to 8. For connecting the multilayer capacitor 41 to the mounting substrate K, it will be sufficient if solder fillets 57 are formed on the outside of the joint surface 53 rising from the substrate connecting surface 52 by reflow of cream solder, so as to bond a land electrode of the mounting substrate K to the substrate connecting surface 52, for example.

When cutting the leading end of the frame joint part 68, a margin similar to that of the first embodiment may be provided. This forms a flange part at the leading end of the rising surface 54, thereby making it possible to keep the terminal electrode 4 from being damaged even when some misalignment in cutting occurs at the time of separating the frame joint part 68 from the planar part 62.

As explained in the foregoing, even when an electrostrictive vibration is generated in the multilayer capacitor 41 upon voltage application, the joint surface 53 joining the substrate connecting surface 52 and terminal connecting surface 51 to each other in the metal terminal 45 disposed about the capacitor element body 3 can flex, so as to mitigate the electrostrictive vibration, thereby preventing chattering noises from occurring. The joint surface 53 secures a sufficient length by being constituted by the intermediate surface 53*a*, first rising surface 53*b*, and second rising surface 53*c* and fully ensures its flexibility by being formed with the cutout 58 extending over the intermediate surface 53*a* and second rising surface 53*c*.

In the multilayer capacitor 41, the step 56 formed by the terminal connecting surface 51, substrate connecting surface 52, and joint surface 53 is positioned within an area overlapping the capacitor element body 3 as seen in the laminating direction of the dielectric layers 2. Therefore, the solder fillets 57 for connecting the multilayer capacitor 41 to the mounting substrate K by reflow do not protrude out of the capacitor element body 3, whereby the packaging density on the mounting substrate K can be improved. The solder fillets 57 can be positioned on the outside of the joint surface 53 rising from the substrate connecting surface 52, so as to make the state of the solder fillets 57 easy to see from the outside and secure a connection yield. Even when the solder fillets 57 are attached to the first rising surface 53*b*, the second rising surface 53*c* is free therefrom, whereby the joint surface 53 can ensure its flexibility.

This multilayer capacitor manufacturing method can form the step 56 constituted by the terminal connecting surface 51, substrate connecting surface 52, and joint surface 53 at once by a simple procedure of just unidirectionally pressing the planar part 62 of the lead frame 61. Mounting the capacitor element body 3 on the terminal connecting surface 51 can easily connect the terminal electrode 4 of the capacitor element body 3 to the terminal connecting surface 51 and arrange the step 56 within an area overlapping the capacitor element body 3 as seen in the laminating direction of the dielectric layers 2 at the same time.

In the lead frame 61, the frame joint part 68 joins the terminal connecting surface equivalent part 65 side of the planar part 62 to the outer frame 69. This inhibits the terminal connecting surface 51 from changing its position between before and after pressing the planar part 62 (see FIG. 9), whereby the positional deviation between the terminal electrode 4 of the capacitor element body 3 and the terminal connecting surface 51 at the time of mounting the capacitor element body 3 onto the terminal connecting surface 51 can be suppressed.

The present invention is not limited to the above-mentioned embodiments. For example, while the terminal connecting surfaces 11, 51 are connected to the terminal electrodes 4 with cream solder in the above-mentioned embodiments, surfaces of the lead frames 21, 61 may be plated beforehand with solder and then heat-treated after mounting the capacitor element body 3 thereon, so as to connect the terminal connecting surfaces 11, 51 to the terminal electrodes 4.

Figure 11:
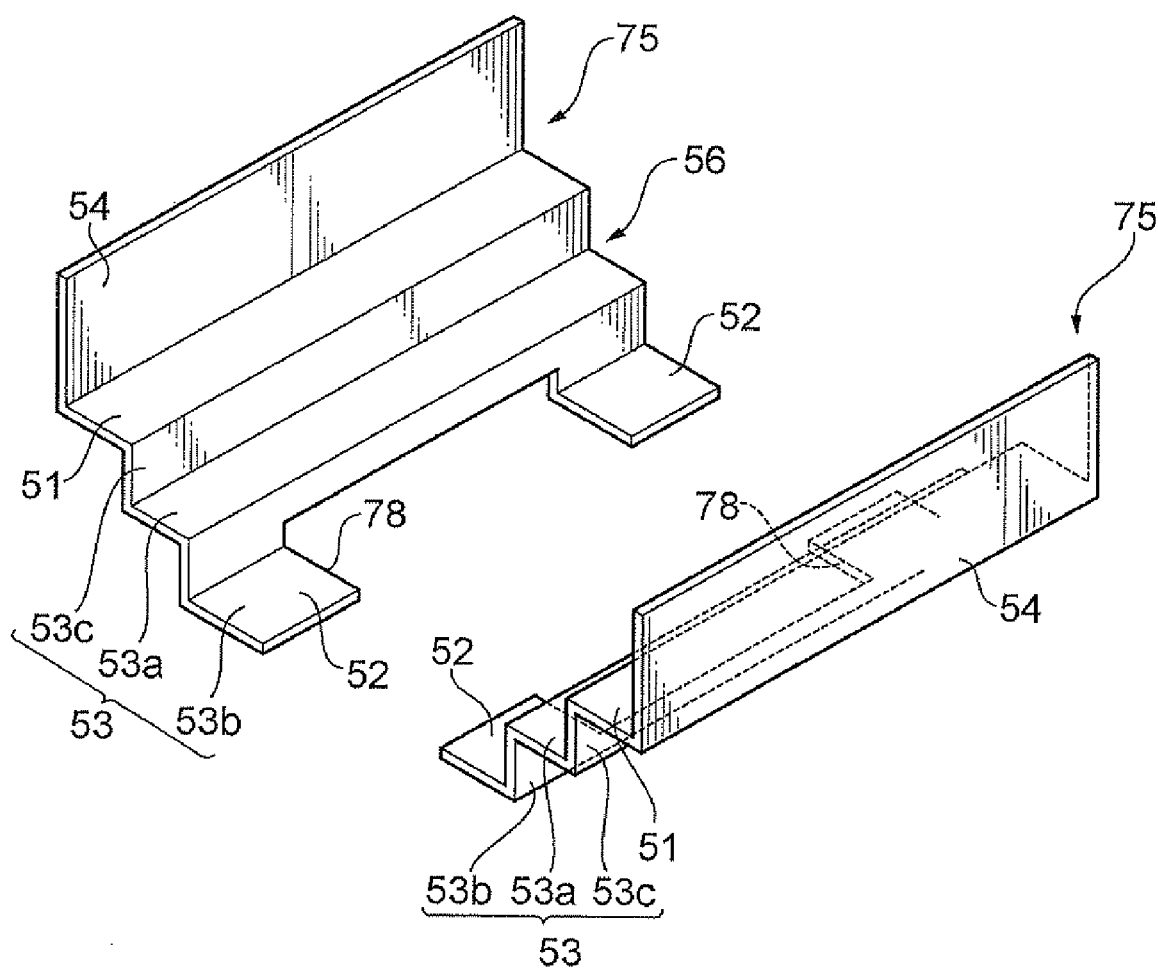
FIG. 11 is a perspective view illustrating a modified example of a cutout.

The cutout may have various forms. For example, while the cutout 58 extends from the upper part of the second rising surface 53c to the end part of the intermediate surface 53a on the center side of the capacitor element body in the joint surface 53 in the second embodiment, a cutout 78 may extend from substantially the lower half portion of the first rising surface 53b to the end part of the substrate connecting surface 52 on the center side of the capacitor element body as in a metal terminal 75 illustrated in FIG. 11. Such a structure also ensures the flexibility of the joint surface 53. This also reduces the contact area between the substrate connecting surface 52 and mounting substrate K, whereby electrostrictive vibrations are harder to transmit to the mounting substrate K.

While the terminal connecting surface equivalent part 25 side of the planar part 22 and the outer frame 29 are joined to each other with the frame joint part 28 in the multilayer capacitor manufacturing process in the first embodiment, the substrate connecting surface equivalent part 23 side of the planar part 22 and the outer frame 29 may be joined to each other with a frame joint part 88 as in a lead frame 81 illustrated in FIG. 12(a), for example. This inhibits the substrate connecting surface 12 from changing its position between before and after pressing as illustrated in FIG. 12(b), whereby deviations in pitches among the planar parts 22, 22 due to pressing can be suppressed. This structure becomes meaningful in particular when the planar part 22 is long in the pressing direction As in a lead frame 91 illustrated in FIG. 13(a), for example, the substrate connecting surface equivalent part 23, joint surface equivalent part 24, terminal connecting surface equivalent part 25, and rising surface equivalent part 26 in the planar part 22 may be oriented orthogonal to those in the lead frames 21, 61, 81, and the terminal connecting surface equivalent part 25 may be joined to the outer frame 29 through a frame joint part 98. A simple procedure of just pressing the planar part 22 of the lead frame 91 can also form the step 16 constituted by the terminal connecting surface 11, substrate connecting surface 12, and joint surface 13 at once in this case as illustrated in FIG. 13(b).

What is claimed is:
1. A multilayer capacitor comprising:
a capacitor element body formed by laminating a plurality of dielectric layers;
a terminal electrode fanned so as to cover an end face of the capacitor element body; and
a metal terminal disposed about the capacitor element body;
wherein the metal terminal has:
a terminal connecting surface connected to the terminal electrode on a bottom face side of the capacitor element body;
a substrate connecting surface arranged closer to a center of the capacitor element body than is the terminal connecting surface while being separated from the bottom face of the capacitor element body by a predetermined distance; and
a joint surface raised from the substrate connecting surface and joined to the terminal connecting surface; and
wherein the terminal connecting surface, substrate connecting surface, and joint surface form a step positioned within an area overlapping the capacitor element body as seen in the laminating direction of the dielectric layers, the step having a cutout at least in the joint surface, and
wherein the cutout is formed in the terminal connecting surface.
2. A multilayer capacitor according to claim 1, wherein the cutout extends from the terminal connecting surface to the substrate connecting surface in the step.
3. A multilayer capacitor according to claim 1, wherein the metal terminal further has a rising surface rising from the terminal connecting surface so as to extend along the end face of the capacitor element body.
4. A multilayer capacitor according to claim 1, wherein the metal terminal has a height not exceeding that of the capacitor element body.
5. A multilayer capacitor according to claim 1, wherein the metal terminal has no overlapping part as seen in the laminating direction of the dielectric layers.
6. A multilayer capacitor comprising:
a capacitor element body formed by laminating a plurality of dielectric layers;
a terminal electrode formed so as to cover an end face of the capacitor element body; and
a metal terminal disposed about the capacitor element body;
wherein the metal terminal has:
a terminal connecting surface connected to the terminal electrode on a bottom face side of the capacitor element body;
a substrate connecting surface arranged closer to a center of the capacitor element body than is the terminal connecting surface while being separated from the bottom face of the capacitor element body by a predetermined distance; and
a joint surface joined to the substrate connecting surface and terminal connecting surface;
wherein the joint surface has;
an intermediate surface arranged at a position between the terminal connecting surface and substrate connecting surface while being separated from the bottom face of the capacitor element body by a distance shorter than the predetermined distance;
a first rising surface raised from the substrate connecting surface and joined to the intermediate surface; and
a second rising surface raised from the intermediate surface and joined to the terminal connecting surface; and
wherein the terminal connecting surface, substrate connecting surface, and joint surface form a step positioned within an area overlapping the capacitor element body as seen in the laminating direction of the dielectric layers.

7. A multilayer capacitor according to claim 6, wherein a cutout is formed in the joint surface.

8. A multilayer capacitor according to claim 6, wherein a cutout is formed in the substrate connecting surface.

9. A multilayer capacitor according to claim 6, wherein the metal terminal further has a rising surface rising from the terminal connecting surface so as to extend along the end face of the capacitor element body.

10. A multilayer capacitor according to claim 6, wherein the metal terminal has a height not exceeding that of the capacitor element body.

11. A multilayer capacitor according to claim 6, wherein the metal terminal has no overlapping part as seen in the laminating direction of the dielectric layers.

12. A method of manufacturing the multilayer capacitor according to claim 1, the method comprising the steps of:
    preparing a lead frame patterned with at least one pair of planar parts each corresponding to the metal terminal, the planar parts opposing each other and being joined to an outer frame through a frame joint part;
    unidirectionally pressing and bending each of the planar parts so as to form a step constituted by the terminal connecting surface, substrate connecting surface, and joint surface;
    mounting the capacitor element body on the terminal connecting surface and connecting the terminal electrode of the capacitor element body to the terminal connecting surface; and
    separating the frame joint part from the planar part.

13. A method of manufacturing the multilayer capacitor according to claim 12, wherein the frame joint part joins a terminal connecting surface equivalent part side of the planar part to the outer frame.

14. A method of manufacturing the multilayer capacitor according to claim 13, wherein the planar part is provided with a margin unbendable by the pressing.

15. A method of manufacturing the multilayer capacitor according to claim 12, wherein the frame joint part joins a substrate connecting surface equivalent part side of the planar part to the outer frame.

16. A method of manufacturing the multilayer capacitor according to claim 12, wherein a surface of the lead frame is plated with solder.

17. A method of manufacturing the multilayer capacitor according to claim 6, the method comprising the steps of:
    preparing a lead frame patterned with at least one pair of planar parts each corresponding to the metal terminal, the planar parts opposing each other and being joined to an outer frame through a frame joint part;
    unidirectionally pressing and bending each of the planar parts so as to form a step constituted by the terminal connecting surface, substrate connecting surface, and joint surface;
    mounting the capacitor element body on the terminal connecting surface and connecting the terminal electrode of the capacitor element body to the terminal connecting surface; and
    separating the frame joint part from the planar part.

18. A multilayer capacitor according to claim 7, wherein the cutout is formed in the terminal connecting surface.

* * * * *